United States Patent
Dugdale

Patent Number: 5,204,886
Date of Patent: Apr. 20, 1993

[54] METHOD OF IMPROVING AN X-RAY LITHOGRAPHY BEAMLINE UNIFORMITY

[75] Inventor: George W. Dugdale, West Redding, Conn.

[73] Assignee: Hughes Danbury Optical Systems, Inc., Danbury, Conn.

[21] Appl. No.: 804,867

[22] Filed: Dec. 6, 1991

[51] Int. Cl.$^5$ ............................................. G01D 18/00
[52] U.S. Cl. ..................................... 378/34; 378/159; 378/207
[58] Field of Search .................. 378/34, 35, 145, 156, 378/158, 159, 204, 207

[56] References Cited

U.S. PATENT DOCUMENTS

| | | | |
|---|---|---|---|
| 4,286,167 | 8/1987 | La Riviere | 378/159 |
| 4,831,640 | 5/1989 | Buckley | 378/34 |
| 4,868,857 | 9/1989 | Dobbins, III | 378/159 |

*Primary Examiner*—David P. Posta
*Attorney, Agent, or Firm*—W. K. Denson-Low; W. J. Streeter; R. A. Hays

[57] ABSTRACT

A method is provided for calibrating a beamline (24) used for X-ray lithography. The beamline includes an elongated evacuated tube (28) extending from an X-ray source (22) for containing the X-ray beam to a closure (32) at an opposite end including a beryllium window. A target wafer (34) aligned with, but external of, the tube is positioned in a plane transverse of the X-ray beamline and is coated with a uniform layer of light sensitive material. A carbon filter (31) intermediate the X-ray source and the target wafer is provided within the tube to block electromagnetic radiation having wavelengths generally in the region of ultraviolet, visible, and infrared ranges of the spectrum. The beam from the X-ray source is scanned through the beamline, through the filter, and onto the target wafer. Thereafter, the wafer is subjected to an etch process thereby forming a contoured surface (34A) emulating the non-uniformities caused by the components of which the beamline is comprised. In a further step, at least one additional layer of filter material is applied to the surface of the carbon filter resulting in a modified carbon filter (31A) having a surface contour which is an inverse image of the surface contour of the target wafer. By so doing, undesired anomolies of X-ray radiation are avoided at the target wafer.

17 Claims, 1 Drawing Sheet

METHOD OF IMPROVING AN X-RAY LITHOGRAPHY BEAMLINE UNIFORMITY

BACKGROUND OF THE INVENTION

1. Field of the Invention

The present invention relates generally to X-ray lithography and, more particularly, to a method of correcting for non-uniformities of the X-ray beam which are unique to a particular beamline and its components. The invention also relates to the method of producing a modified heat filter which can accomplish such a correction.

2. Description of the Prior Art

Continuing efforts are being made toward the goal of producing the microscopic features of a new generation of extremely complex integrated electronic circuits such as dynamic random access memories, or DRAMs. By way of example, such anticipated circuits will be capable of containing more than 256 megabytes of information on a microchip sized somewhat larger than a thumbnail. In comparison, current lithographic techniques which use visible light only enable the manufacture of similar sized chips containing up to approximately 64 megabits.

In order to achieve this new plateau of integrated circuit capability, more and more emphasis is being placed on X-ray lithography. Although researchers have experimented with X-ray lithography with such a goal in mind for approximately 20 years, a number of problems with the technique remain before it will be commercially useful.

Optical technology currently being employed and X-ray lithography share some common elements. Both require that manufacturers use "masks" etched with the desired circuit design. Circular silicon wafers, which are eventually separated or diced up into 100 or more chips, are coated with a lithosensitive material, or "resist." Workers then shine ultra violet light or X-rays through the mask onto the wafer, exposing areas of the resist. Washing the wafer with a solvent dissolves the unwanted resist and leaves a copy or pattern of the mask design on the wafer. A finished chip is a sandwich of as many as 20 circuit layers.

As circuit designs become more dense, the wavelength of visible light becomes as troublesome for printing circuits as, by way of analogy, a dull crayon is for drawing narrow lines. Several years ago workers expected the limit of the capability of optical lithography would be to produce circuit lines having a width of approximately 0.5 micron. Four-megabit DRAM's, which can store four million bits of data and are currently the most advanced memory chips on the market, have circuit lines measuring about 0.8 micron in width. But by improving resists and turning to excimer lasers for shorter wavelengths in the deep-ultraviolet range, researchers have further extended optical technology to 0.35 micron which is sufficient to produce a 64-megabit DRAM.

X-rays, given their shorter wavelengths, should work well at 0.25 to 0.2 micron which is the anticipated feature size of 256-megabit chips. Moreover, workers can print crisper lines with X-rays than with visible or ultra violet light because the shorter wavelength means that light stays focused over a longer distance.

A particularly troublesome problem still being faced by researchers of the X-ray lithography technique resides in the observation that each X-ray beamline, including its associated components, has its own unique and permanent signature of non-uniform radiation reaching the photoresist on the target wafer. This is due to imperfections in the collimating mirror, and density variations in the heat filter, beryllium window, and X-ray mask membranes. This signature of non-uniform radiation is undesirably superimposed on all intended radiation employed for producing circuitry on a microchip. This results in imperfections in the circuitry which cannot be tolerated commercially.

It was in light of the prior art as just described that the present invention has been conceived and now reduced to practice.

SUMMARY OF THE INVENTION

The present invention relates to a method of calibrating a beamline used for X-ray lithography. The beamline includes an elongated evacuated tube extending from an X-ray source for containing the X-ray beam to a closure at an opposite end including a beryllium window. A target wafer aligned with, but external of, the tube is positioned in a plane transverse of the X-ray beamline and is coated with a uniform layer of light sensitive material. A carbon filter located between the X-ray source and the target wafer is provided within the tube to block electromagnetic radiation having wavelengths generally in the region of ultraviolet, visible, and infrared ranges of the spectrum. The beam from the X-ray source is scanned through the beamline, through the filter, and through a mask with an appropriate test pattern, and onto the target wafer. Thereafter, the wafer is subjected to an etch process so that line widths can be measured to evaluate the exposure uniformity. From this data, a contoured surface emerges, the non-uniformities caused by the components of which the beamline is comprised. In a further step, at least one additional layer of filter material is applied to the surface of the carbon filter resulting in a modified carbon filter having a surface contour which is an inverse image of the surface contour of the target wafer. By so doing, undesired anomalies of X-ray radiation are avoided at the target wafer.

One object of the invention is to provide a correction for non uniformities in the X-ray radiation which customarily occur during operation of a beamline used for lithographic purposes.

Another object of the invention is to produce on a target wafer employed with an X-ray beamline a non uniformity map of X-ray radiation, then to selectively add X-ray absorbing material to a heat filter in the beamline in inverse proportion to the map of the target wafer thereby offsetting any anomolies which exist in the X-ray radiation caused by the beamline and its components.

Still another object of the invention is to provide a modified heat filter for an X-ray beamline which compensates for non uniform X-ray radiation caused by the beamline and its associated components.

Another application of the invention is to provide a modified membrane in any synchrotron beamline where compensation for non uniform X-ray flux is a critical issue. This modification would be very helpful in those synchrotron beams which also rely on either a narrow spectral range of X-rays as well as those with energy amplitude non-uniformity. By applying a selection of various materials of varying thicknesses, the wavelength content as well as the amplitude content can be controlled by a single element.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and, together with the description, serve to explain the principles of the invention in general terms. Like numerals refer to like parts throughout the disclosure.

BRIEF DESCRIPTION OF THE DRAWING

FIG. 1B is a modified heat filter.

FIG. 1C is a map or contour.

DETAILED DESCRIPTION OF THE PREFERRED EMBODIMENT

Figure 1A:
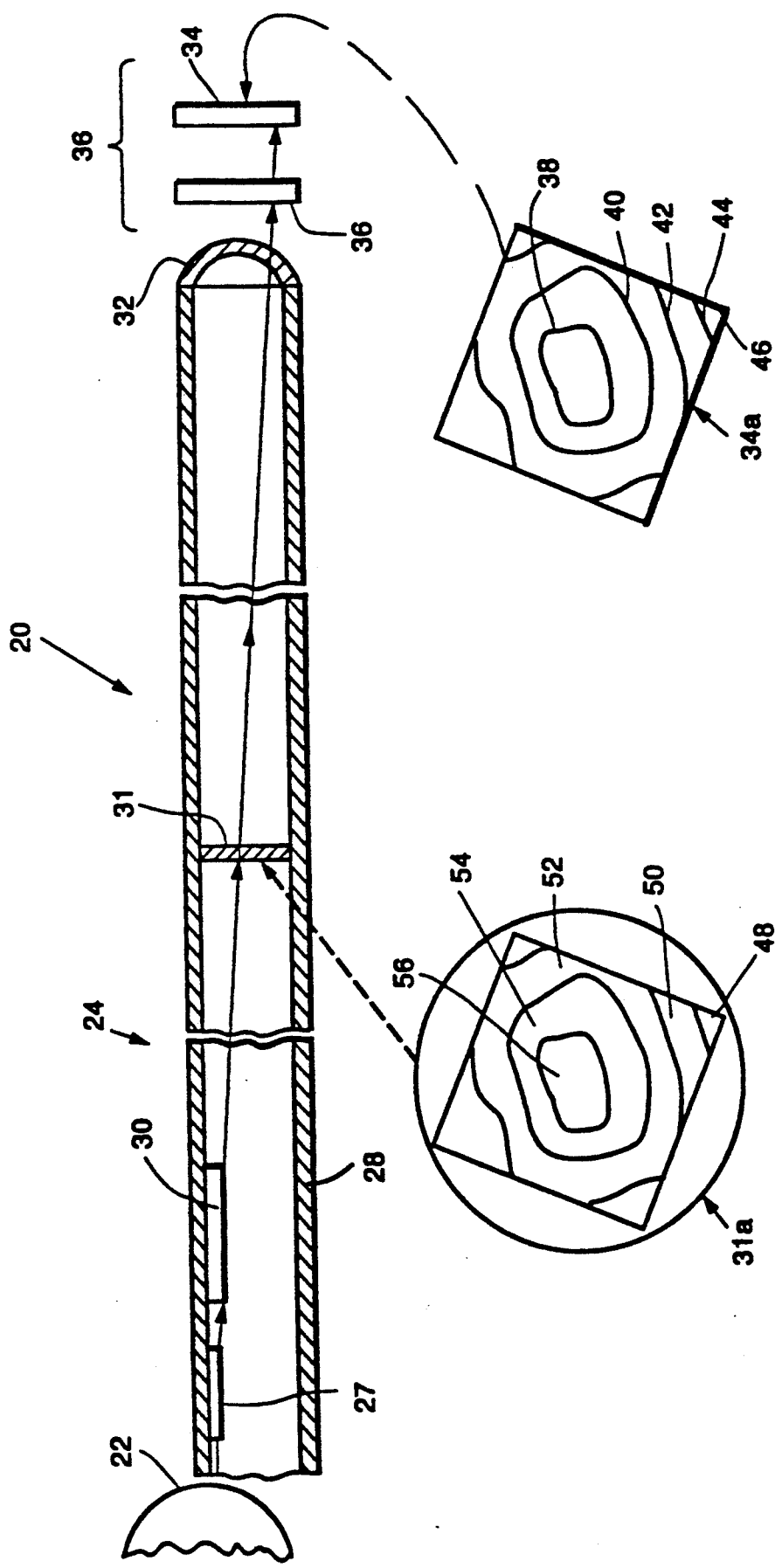
FIGS. 1A-1C are diagrammatic views certain parts being cut away and shown in section, illustrating an X-ray lithographic system embodying the invention.

Turn now to the drawing in FIG. 1 which depicts an X-ray lithographic system 20 which is a typical arrangement for purposes of the invention. It includes an X-ray source 22, a beamline 24, and an aligner station 26. The X-ray source 22 is preferably a synchrotron which is a known device for accelerating charged particles in a vacuum. The particles are guided by a change in magnetic field while being accelerated many times in a closed path by a radio frequency electric field. These compact ring sources produce the brightest X-rays and, in addition, emit substantially collimated beams. However, it is not required that this be a microlithography application as indicated by the drawing. Any process which requires both spectrally controlled and amplitude uniformity controlled X-rays is also applicable.

In this instance, the synchrotron discharges a beam 26 of X-ray radiation into the beamline 24. The beamline 24 includes an elongated tube 28 which is suitably evacuated. At a location close to the synchrotron 22, but positioned within the tube 28, is a collimating mirror 30, preferably toroidal, which is used to scan the long narrow fan of the radiated beam 26 into a rectangular or square format, utilizing a gold coating at grazing incidence.

In a typical installation, the beamline 24 may be 30 feet long as it extends between the synchrotron 22 and the aligner station 26.

Also internal to the tube 28 is a thin carbon membrane, or heat filter 31, used to pass the X-ray wavelengths while blocking the ultraviolet, visible and infrared radiation. The heat filter reduces the heat which would otherwise be transmitted to the remaining components of the beamline 24 and to those components at the aligner station 26.

The X-ray beam 27 continues through the beamline 24, exiting through a beryllium window 32 which is a membrane employed to withstand the pressure differential between the vacuum of the beamline and the helium atmosphere customarily employed in the aligner station 26. A target wafer 34 is suitably, removably, supported in the aligner station 26 and is provided with a uniform layer of light sensitive material, for example, photoresist. The target wafer 34 is spaced approximately 50 microns from a patterned silicon membrane mask 36 employed during the normal operation of the X-ray lithographic system 20. However, for the purpose of performing the calibration operation of the invention, a test pattern mask 36 is employed.

It has come to be recognized by this inventor that each X-ray lithographic system 20 exhibits its own unique and substantially permanent signature of non-uniform radiation reaching the target wafer 34. This is the result, in substantial part, of an imperfect collimating mirror and density variations in the heat filter 31, beryllium window 32, an X-ray membrane mask 36. By correcting for these radiation variations, it will be possible to achieve the specific pattern sought at the target wafer 34. From experience, it has been found that pattern uniformities in the range of +/−2.0% and better are required in order to successfully accomplish X-ray lithography.

According to the invention, the suitably collimated X-ray beam 27 is directed onto the target wafer 34 in the absence of the mask 36. Whatever anomolies exist in the system 20 will thereby be imprinted onto the target wafer 34. Thereupon, the wafer is removed from the aligner station 26 and subjected to an etch process so as to develop the resulting pattern in the form of an intensity profile or map. The etch process may be a chemical etch, an ion beam etch, or other suitable process for removing appropriate photoresist material so as to achieve the desired pattern.

Figure 1C:
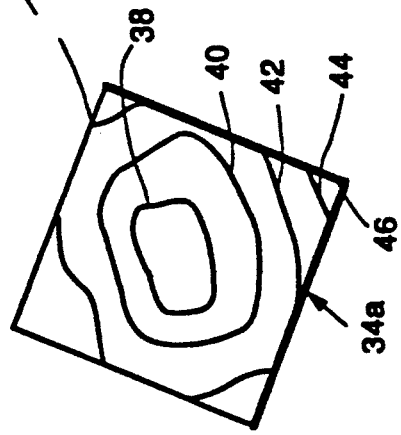

In FIG. 1C, the reference numeral 34A is intended to depict a map or contour resulting from the X-ray irradiation in the absence of the mask 36. As indicated, the map 34A displays a pattern which includes a plateau 38 of highest relief, and plateaus 40, 42, and 44 of successively lower relief, and ends at a lowermost plateau 46.

Figure 1B:
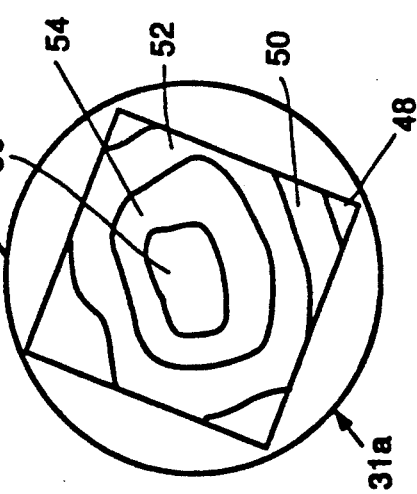

In a known manner, the carbon filter 31, which is supported on the tube 28 by means of a suitable, readily demountable assembly, is removed from the tube 28. Thereupon, it is subjected to any suitable process for depositing additional filter material to its surface as a mirror image of the map 34A. To this end, a series of coating masks are generated to conform to the contours of the map 34A. As shown in FIG. 1B, these masks result in the formation of a series of valley-type plateaus of ever greater depths beginning at a highest plateau 48 and continuing to ever deeper plateaus 50, 52, and 54, and terminating at a deepest plateau 56. The end result is a modified heat filter 31A.

Thereafter, whenever the X-ray lithographic system is operated with the use of the mask 36 and incorporating a modified filter 31A, the target wafer 34 is subjected not only to X-ray radiation with inherent anomolies resulting from the particular hardware being used; it is also subjected to a correction provided by the modified filter 31A which serves to completely offset those anomolies. In this manner, the resulting pattern on the target wafer 34 is accurate and not affected by reason of any imperfections in the X-ray lithographic system 20.

This method of correction remains the same for any other processes that utilize X-ray synchrotron radiation that have specific intensity amplitude and spectral content requirements.

While preferred embodiments of the invention have been disclosed in detail, it should be understood by those skilled in the art that various other modifications may be made to the illustrated embodiment without departing from the scope of the invention as described in the specification and defined in the appended claims.

I claim:

1. A method of calibrating a beamline for applications requiring spectrally controlled and amplitude uniformity controlled X-rays comprising the steps of:
   (a) providing a target wafer with a uniform layer of light sensitive material;
   (b) directing a beam from an X-ray source through the beamline and onto the target wafer positioned in a plane transverse of the X-ray beamline;
   (c) subjecting the wafer to an etch process so as to develop the pattern resulting from step (b) thereby forming a contoured surface emulating the non-uniformities caused by the components of which the beamline is comprised;
   (d) providing a carbon filter intermediate the X-ray source and the target wafer to block electromagnetic radiation; and
   (e) applying to the surface of the carbon filter at least one additional layer of filter material resulting in a modified carbon filter having a surface contour which is in inverse proportion to the surface contour of the target wafer.

2. A method of calibrating as set forth in claim 1 wherein the light sensitive material utilized in step (a) is photoresist.

3. A method of calibrating as set forth in claim 1 wherein the beamline includes:
   an elongated evacuated tube extending from the X-ray source for containing the X-ray beam to a closure at an opposite end including a beryllium window; and
   including the step of;
   (f) scanning the X-ray beam within the elongated evacuated tube into a rectangular format for reception onto the target wafer.

4. A method of calibrating as set forth in claim 3 wherein step (f) is performed with the use of a collimating toroidal mirror.

5. A method of calibrating as set forth in claim 3 wherein the contoured surface resulting from step (c) comprises a plurality of distinct contour levels;
   wherein step (e) includes the steps of:
   (g) by masking using a plurality of masks in succession, applying a plurality of successive layers of additional filter material to the carbon filter.

6. A method of calibrating as set forth in claim 3 wherein each additional layer of filter material comprises an X-ray absorbing material having characteristics of low atomic number, high melting point, and low vapor pressure.

7. A method of calibrating as set forth in claim 1 wherein the X-ray absorbing material is at least one of carbon and tungsten.

8. A method of calibrating as set forth in claim 1 wherein the X-ray source includes a synchrotron.

9. A modified carbon filter produced by the method of claim 1.

10. A method of producing a modified carbon filter for calibrating a system used in X-ray lithography, the system comprising an X-ray source; a beamline including an elongated evacuated tube extending from the X-ray source to a closure at an opposite end including a beryllium window, the beamline operable for containing a beam of radiation from the X-ray source; a target wafer having a uniform surface thereon of light sensitive material, the target wafer being aligned with the beamline and spaced from the beryllium window and external of the beamline; a carbon filter within the elongated evacuated tube intermediate the X-ray source and the target wafer for blocking electromagnetic radiation having wavelengths generally in the region of ultraviolet, visible, and infrared ranges of the spectrum; and means for scanning the X-ray beam into a rectangular format for reception onto the target wafer, said method comprising the steps of:
   (a) providing the target wafer with a uniform layer of light sensitive material;
   (b) directing a beam from the X-ray source through the beamline and onto the target wafer positioned in a plane transverse of the X-ray beamline;
   (c) subjecting the wafer to an etch process so as to develop the pattern resulting from step (b) thereby forming a contoured surface emulating the non-uniformities caused by the components of which the beamline is comprised;
   (d) providing a carbon filter intermediate the X-ray source and the target wafer to block electromagnetic radiation having wavelengths generally in the region of ultraviolet, visible, and infrared ranges of the spectrum; and
   (e) applying to the surface of the carbon filter at least one additional layer of filter material resulting in a modified carbon filter having a surface contour which is in inverse proportion to the surface contour of the target wafer 11. A method of producing a modified carbon filter as set forth in claim 1
   wherein the light sensitive material utilized in step (a) is photoresist.

12. A method of producing a modified carbon filter as set forth in claim 10
   including the step of;
   (f) scanning the X-ray beam within the elongated evacuated tube into a rectangular format for reception onto the target wafer.

13. A method of producing a modified carbon filter as set forth in claim 12
   wherein step (f) is performed with the use of a collimating toroidal mirror.

14. A method of producing a modified carbon filter as set forth in claim 10
   wherein the contoured surface resulting from step (c) comprises a plurality of distinct contour levels;
   wherein step (e) includes the step of:
   (g) by masking using a plurality of masks in succession, applying a plurality of successive layers of additional filter material to the carbon filter.

15. A method of producing a modified carbon filter as set forth in claim 12
   wherein each additional layer of filter material comprises an X-ray absorbing material having characteristics of low atomic number, high melting point, and low vapor pressure.

16. A method of producing a modified carbon filter as set forth in claim 10
   wherein the X-ray absorbing material is at least one of carbon and tungsten.

17. A method of producing a modified carbon filter as set forth in claim 10
   wherein the X-ray source includes a synchrotron.

* * * * *